(12) United States Patent
Huang et al.

(10) Patent No.: US 11,334,127 B2
(45) Date of Patent: May 17, 2022

(54) CONVERTIBLE COLD AISLE AND HOT AISLE COOLING SOLUTIONS WITH A COMMON CHASSIS DESIGN

(71) Applicant: Dell Products L.P., Round Rock, TX (US)

(72) Inventors: Chin-An Huang, New Taipei (TW); Chen-Fa Wu, Tao-Yuan (TW)

(73) Assignee: Dell Products L.P., Round Rock, TX (US)

( * ) Notice: Subject to any disclaimer, the term of this patent is extended or adjusted under 35 U.S.C. 154(b) by 36 days.

(21) Appl. No.: 16/984,696

(22) Filed: Aug. 4, 2020

(65) Prior Publication Data
US 2022/0043491 A1 Feb. 10, 2022

(51) Int. Cl.
*G06F 1/20* (2006.01)
*H05K 7/20* (2006.01)

(52) U.S. Cl.
CPC ........... *G06F 1/20* (2013.01); *H05K 7/20145* (2013.01); *H05K 7/20736* (2013.01)

(58) Field of Classification Search
CPC ........... H05K 7/20745; H05K 7/20836; H05K 7/20736; H05K 7/20145; H05K 7/20827; H05K 7/1497; H05K 7/2079; H05K 7/20781; H05K 7/20718; G06F 1/20; G06F 2200/201
See application file for complete search history.

(56) References Cited

U.S. PATENT DOCUMENTS

| | | | | |
|---|---|---|---|---|
| 7,054,155 B1 * | 5/2006 | Mease | ................ | H05K 7/20581 165/104.34 |
| 7,434,743 B2 * | 10/2008 | Barsun | ...................... | G06F 1/20 165/80.3 |
| 7,492,591 B1 * | 2/2009 | Aybay | ................ | H05K 7/20581 312/236 |
| 8,068,340 B1 * | 11/2011 | Nguyen | ................ | F04D 29/601 361/695 |
| 8,320,120 B1 * | 11/2012 | Chan | .................. | H05K 7/20727 361/679.49 |
| 9,173,326 B1 * | 10/2015 | Smith | ................ | H05K 7/20727 |
| 9,999,161 B2 * | 6/2018 | Mease | ................ | H05K 7/20172 |
| 10,912,216 B1 * | 2/2021 | Chia | .................... | H05K 5/0256 |
| 2005/0225936 A1 * | 10/2005 | Day | .................... | H05K 7/20754 361/679.47 |
| 2008/0037214 A1 * | 2/2008 | Niazi | ....................... | G06F 1/20 361/679.3 |

* cited by examiner

*Primary Examiner* — Adam B Dravininkas
(74) *Attorney, Agent, or Firm* — Jackson Walker L.L.P.

(57) ABSTRACT

An air mover board may include a cold-aisle power and cold-aisle signal connector located on a first edge of the air mover board and configured to couple to a corresponding connector of an information handling system when the air mover board is in a cold-aisle configuration, a hot-aisle power and hot-aisle signal connector located on a second edge of the air mover board opposite that of the first edge and configured to couple to the corresponding connector of an information handling system when the air mover board is in a hot-aisle configuration, and a plurality of mechanical features configured to align and maintain the air mover board in a fixed position relative to an air mover tray, including a feature permanently coupled to the air mover board and configured to mechanically couple to features of the air mover tray in the cold-aisle and hot-aisle configuration.

13 Claims, 8 Drawing Sheets

CONVERTIBLE COLD AISLE AND HOT AISLE COOLING SOLUTIONS WITH A COMMON CHASSIS DESIGN

TECHNICAL FIELD

The present disclosure relates in general to information handling systems, and more particularly to a convertible cold aisle and hot aisle cooling solution with a common information handling system chassis design.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

As processors, graphics cards, random access memory (RAM) and other components in information handling systems have increased in clock speed and power consumption, the amount of heat produced by such components as a side-effect of normal operation has also increased. Often, the temperatures of these components need to be kept within a reasonable range to prevent overheating, instability, malfunction and damage leading to a shortened component lifespan. Accordingly, cooling fans and blowers, referred to generally herein as "air movers," have often been used in information handling systems to cool information handling systems and their components.

In datacenter environments, it may be desirable to configure the datacenter such that some aisles in the datacenter are "cold aisles" to which air movers intake air and some aisles are "hot aisles" from which air movers exhaust air. However, using existing implementations, cold-aisle information handling systems may have motherboards and electrical connectors for air movers that are unique to those for hot-aisle information handling systems.

Disadvantages to having multiple unique boards and chassis assemblies may include higher material costs, higher logistics management costs, and increased service complexity.

SUMMARY

In accordance with the teachings of the present disclosure, the disadvantages and problems associated with traditional approaches to supporting information handling systems in a datacenter in cold aisle and hot aisle configurations may be substantially reduced or eliminated.

In accordance with embodiments of the present disclosure, an air mover board may include a cold-aisle power connector located on a first edge of the air mover board and configured to couple to a corresponding power connector of an information handling system when the air mover board is in a cold-aisle configuration, a cold-aisle signal connector located on the first edge of the air mover board and configured to couple to a corresponding signal connector of the information handling system when the air mover board is in the cold-aisle configuration, a hot-aisle power connector located on a second edge of the air mover board opposite that of the first edge and configured to couple to the corresponding power connector of an information handling system when the air mover board is in a hot-aisle configuration, and a hot-aisle signal connector located on the second edge of the air mover board and configured to couple to the corresponding signal connector of the information handling system when the air mover board is in the hot-aisle configuration.

In accordance with these and other embodiments of the present disclosure, an air mover tray may include a plurality of mechanical features configured to align an air mover board relative to the air mover tray and maintain the air mover board in a fixed position relative to the air mover tray, wherein the plurality of mechanical features includes a first feature configured to mechanically couple to a feature of the air mover board in a cold-aisle configuration of the air mover board in order to maintain the air mover board in the fixed position relative to the air mover tray and a second feature configured to mechanically couple to the feature of the air mover board in a hot-aisle configuration of the air mover board in order to maintain the air mover board in the fixed position relative to the air mover tray.

In accordance with these and other embodiments of the present disclosure, an information handling system may include a chassis, a backplane housed within the chassis, the backplane comprising a power connector and a signal connector, an air mover cage formed in the chassis for housing a plurality of air movers, a bay formed in the chassis adjacent to the air mover cage and configured to receive an assembly of an air mover board and an air mover tray, and the air mover board. The air mover board may include a plurality of air mover connectors, each air mover connector configured to electrically couple an air mover housed in the air mover cage to the air mover board, a cold-aisle power connector located on a first edge of the air mover board and configured to couple to the power connector when the air mover board is in a cold-aisle configuration, a cold-aisle signal connector located on the first edge of the air mover board and configured to couple to a corresponding signal connector of the information handling system when the air mover board is in the cold-aisle configuration, a hot-aisle power connector located on a second edge of the air mover board opposite that of the first edge and configured to couple to the corresponding power connector of an information handling system when the air mover board is in a hot-aisle configuration, and a hot-aisle signal connector located on the second edge of the air mover board and configured to couple to the corresponding signal connector of the information handling system when the air mover board is in the hot-aisle configuration.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Preferred embodiments and their advantages are best understood by reference to FIGS. 1 through 6B, wherein like numbers are used to indicate like and corresponding parts.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network storage device, or any other suitable device and may vary in size, shape, performance, functionality, and price. The information handling system may include memory, one or more processing resources such as a central processing unit (CPU) or hardware or software control logic. Additional components or the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, information handling resources may broadly refer to any component system, device or apparatus of an information handling system, including without limitation processors, buses, memories, input-output devices and/or interfaces, storage resources, network interfaces, motherboards, integrated circuit packages; electro-mechanical devices (e.g., air movers), displays, and power supplies.

Figure 1A:
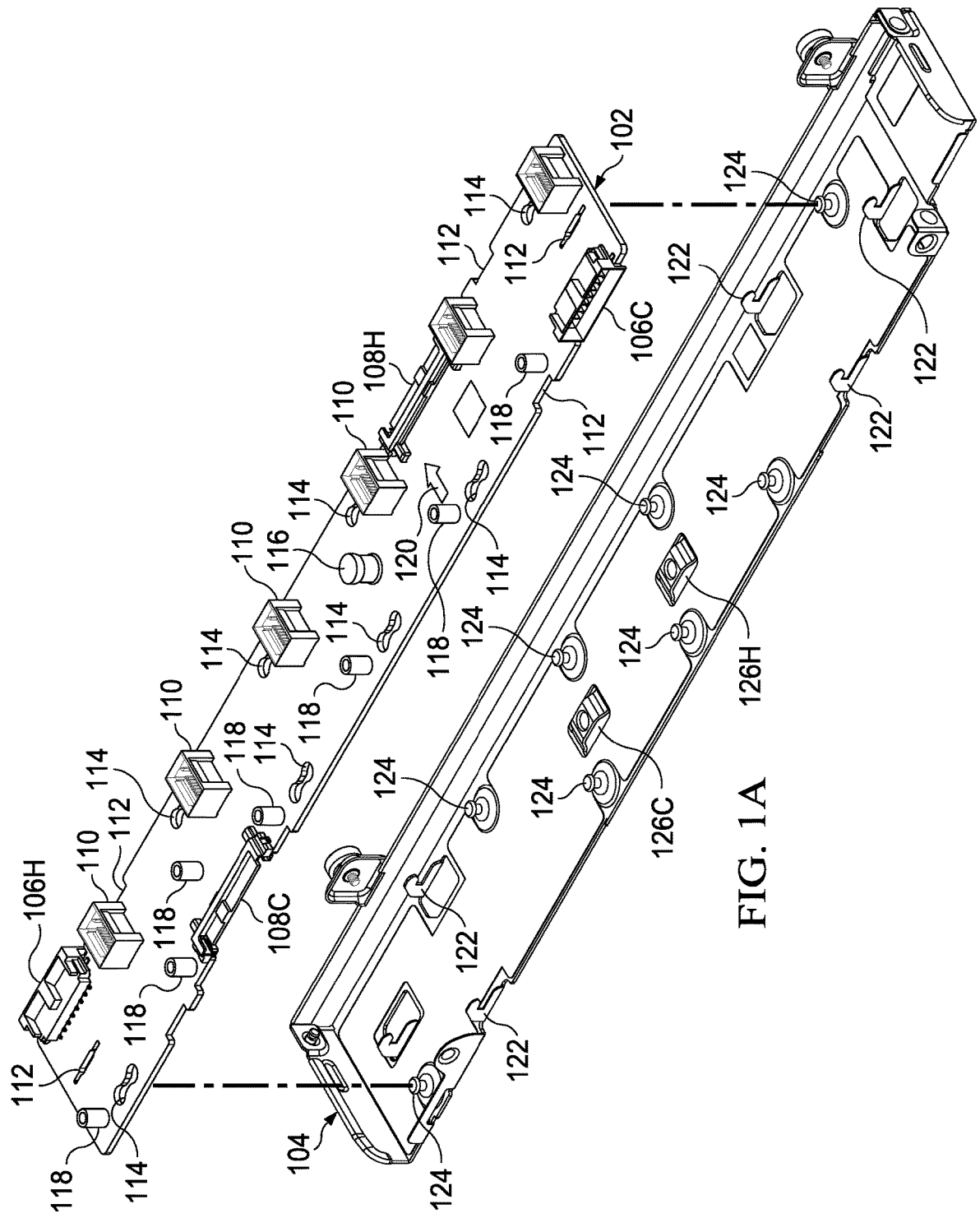
FIG. 1A illustrates an air mover board and an air mover tray configured in a cold-aisle configuration, in accordance with embodiments of the present disclosure.

FIG. 1A illustrates an air mover board 102 and an air mover tray 104 configured in a cold-aisle configuration, in accordance with embodiments of the present disclosure. Similarly, FIG. 1B illustrates air mover board 102 and air mover tray 104 configured in a hot-aisle configuration, in accordance with embodiments of the present disclosure.

Figure 1B:
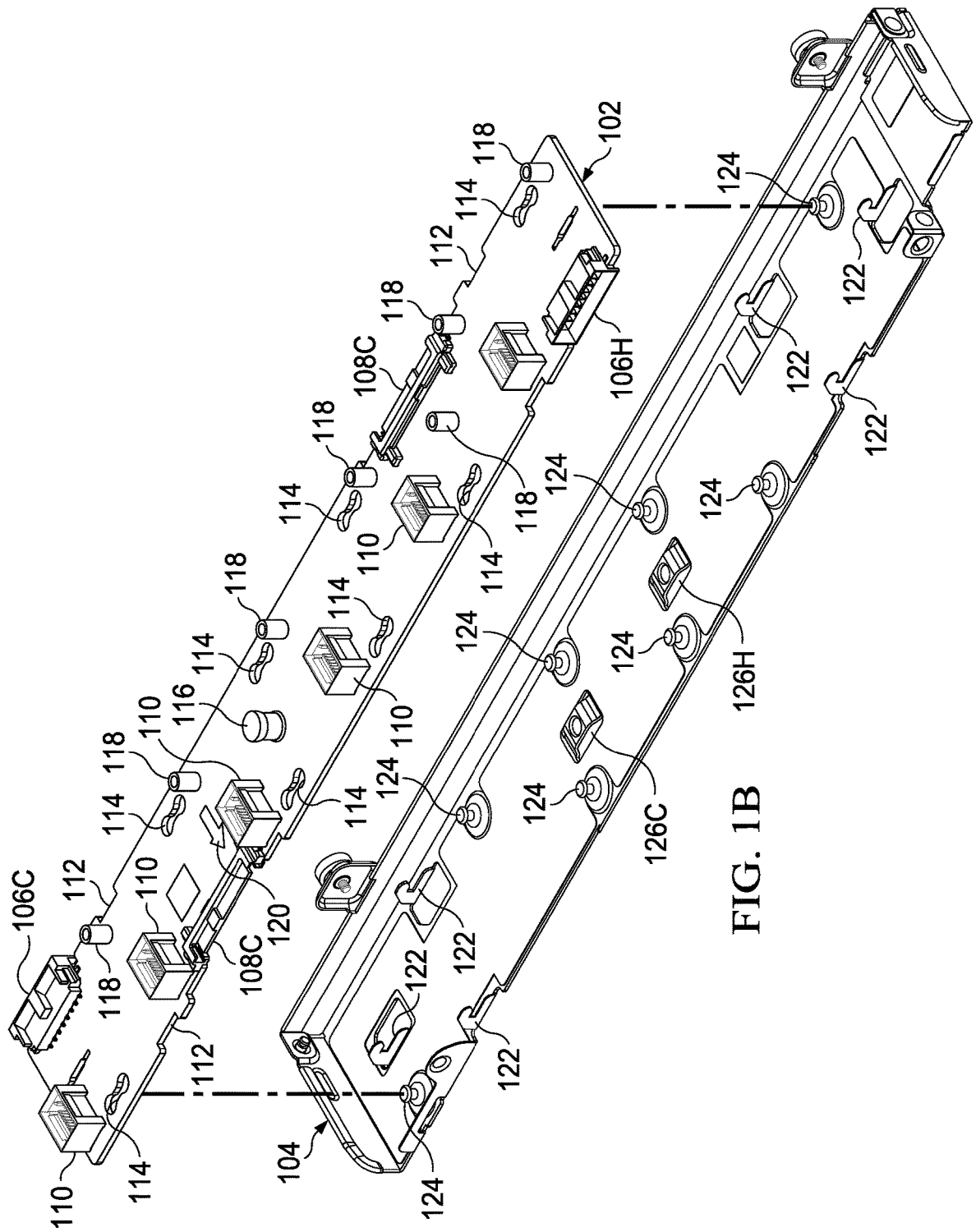
FIG. 1B illustrates an air mover board and an air mover tray configured in a hot-aisle configuration, in accordance with embodiments of the present disclosure.

As shown in FIGS. 1A and 1B, air mover board 102 may comprise cold-aisle configuration power connector 106C, hot-aisle configuration power connector 106H, cold-aisle configuration signal connector 108C, hot-aisle configuration signal connector 108H, air mover connectors 110, alignment features 112, keyhole slots 114, plunger 116, standoffs 118, and airflow direction indicator 120. Further as shown in FIGS. 1A and 1B, air mover tray 104 may comprise hooks 122, standoffs 124, cold-aisle configuration bridge 126C, and hot-aisle configuration bridge 126H.

Each of cold-aisle configuration power connector 106C and hot-aisle configuration power connector 106H may be configured to, when coupled to a corresponding connector of a motherboard or other backplane of an information handling system, receive electrical energy from such motherboard or backplane for transmission of such electrical energy to components of air mover board 102, including any air movers coupled to air mover connectors 110. Each of cold-aisle configuration signal connector 108C and hot-aisle configuration signal connector 108H may be configured to, when coupled to a corresponding connector of a motherboard or other backplane of an information handling system, receive from or transmit to such motherboard or backplane signals relating to operation of components of air mover board 102, including any air movers coupled to air mover connectors 110. Such signals may include, without limitation, driving signals for controlling air mover speeds, tachometer signals indicative of measured air mover speeds, and/or any other appropriate signals.

In a cold-aisle configuration of an information handling system and air mover board 102, cold-aisle configuration power connector 106C and cold-aisle configuration signal connector 108C may, when air mover board 102 and air mover tray 104 are inserted into the information handling system, blind-mate couple to a respective power connector and signal connector on a motherboard or other backplane of the information handling system, as described in greater detail below. In the cold-aisle configuration, hot-aisle configuration power connector 106H and hot-aisle configuration signal connector 108H may remain decoupled from any other corresponding connectors.

Similarly, in a hot-aisle configuration of an information handling system and air mover board 102, hot-aisle configuration power connector 106H and hot-aisle configuration signal connector 108H may, when air mover board 102 and air mover tray 104 are inserted into the information handling system, blind-mate couple to a respective power connector and signal connector on a motherboard or other backplane of the information handling system, as described in greater detail below. In the hot-aisle configuration, cold-aisle configuration power connector 106C and cold-aisle configuration signal connector 108C may remain decoupled from any other corresponding connectors.

To mechanically couple air mover board 102 to air mover tray 104, air mover board 102 may be lowered upon air mover tray 104 in a first direction relative to air mover tray 104 such that alignment features 112 of air mover board 102 align with hooks 122 of air mover tray 104 and such that keyhole slots 114 of air mover board 102 align with standoffs 124 of air mover tray 104. One air mover board 102 is lowered onto air mover tray 104 with such alignment, air mover board 102 may be moved relative to air mover tray 104 in a second direction relative to air mover tray 104 normal to the first direction, such that hooks 122 retain air mover board 102 at alignment features 112 and standoffs 124 retain air mover board 102 at keyhole slots 114. Once air mover board 102 is properly positioned relative to air mover tray 104, plunger 116 may mechanically engage with either of a corresponding hole of cold-aisle configuration bridge 126C or a corresponding hole of hot-aisle configuration bridge 126H, depending on whether air mover board 102 is in the cold aisle configuration or hot aisle configuration. Further, when air mover board 102 is coupled to air mover tray 104, airflow direction indicator 120 may indicate an airflow direction from air movers coupled to air mover connectors 110.

To mechanically decouple air mover board 102 from air mover tray 104, a user (e.g., an administrator or technician) may pull on or otherwise interact with plunger 116 to disengage plunger 116 from the hole on cold-aisle configuration bridge 126C or hot-aisle configuration bridge 126H, and reverse the steps described above for coupling air mover board 102 to air mover tray 104.

Notably, the main difference between the cold-aisle configuration and the hot-aisle configuration of air mover board 102 relative to air mover tray 104 is that air mover board 102 may be rotated 180 degrees relative to air mover tray 104 between the two configurations.

Figure 2A:
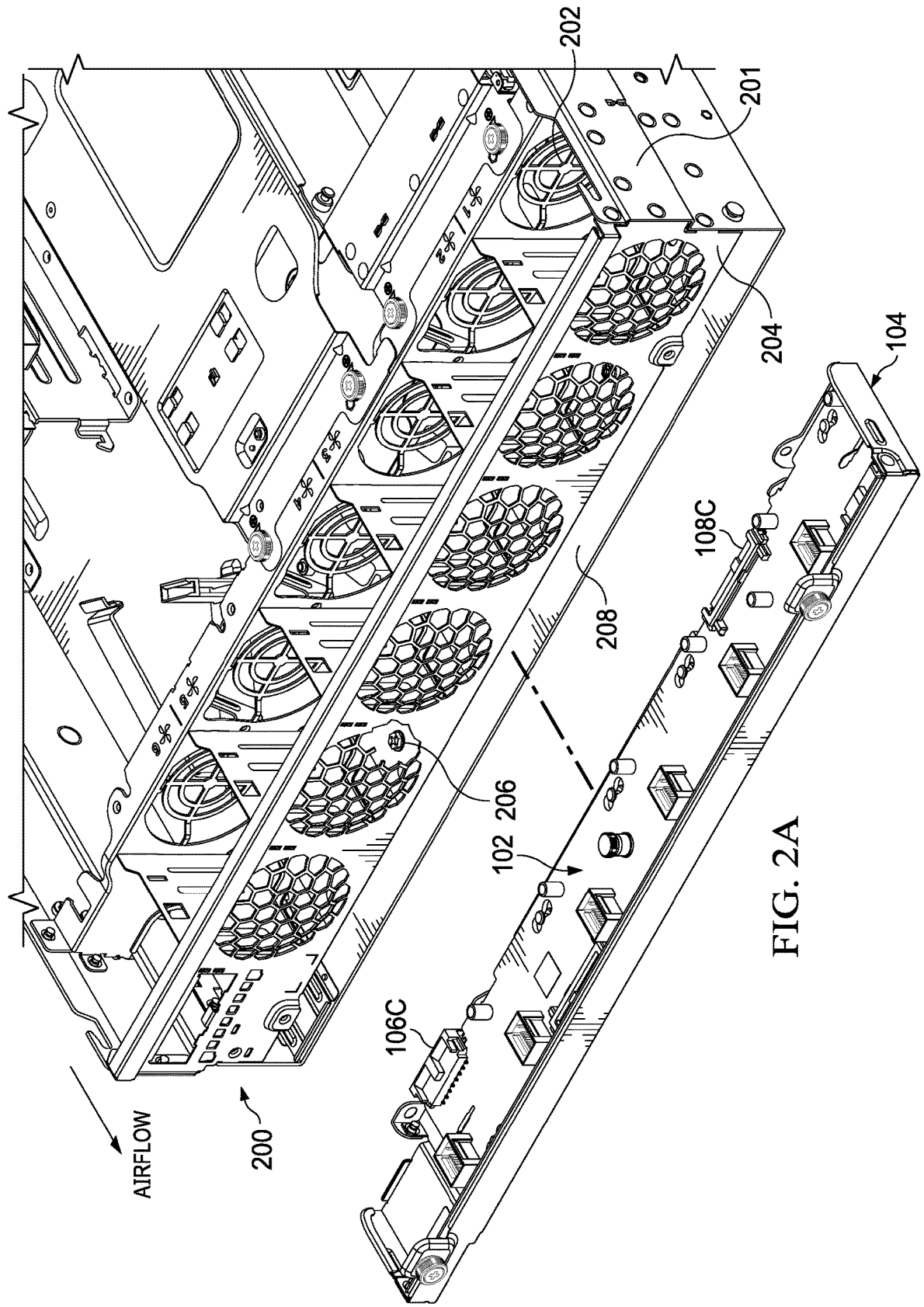
FIG. 2A illustrates an example information handling system configured in a cold-aisle configuration, in accordance with embodiments of the present disclosure.
Figure 2B:
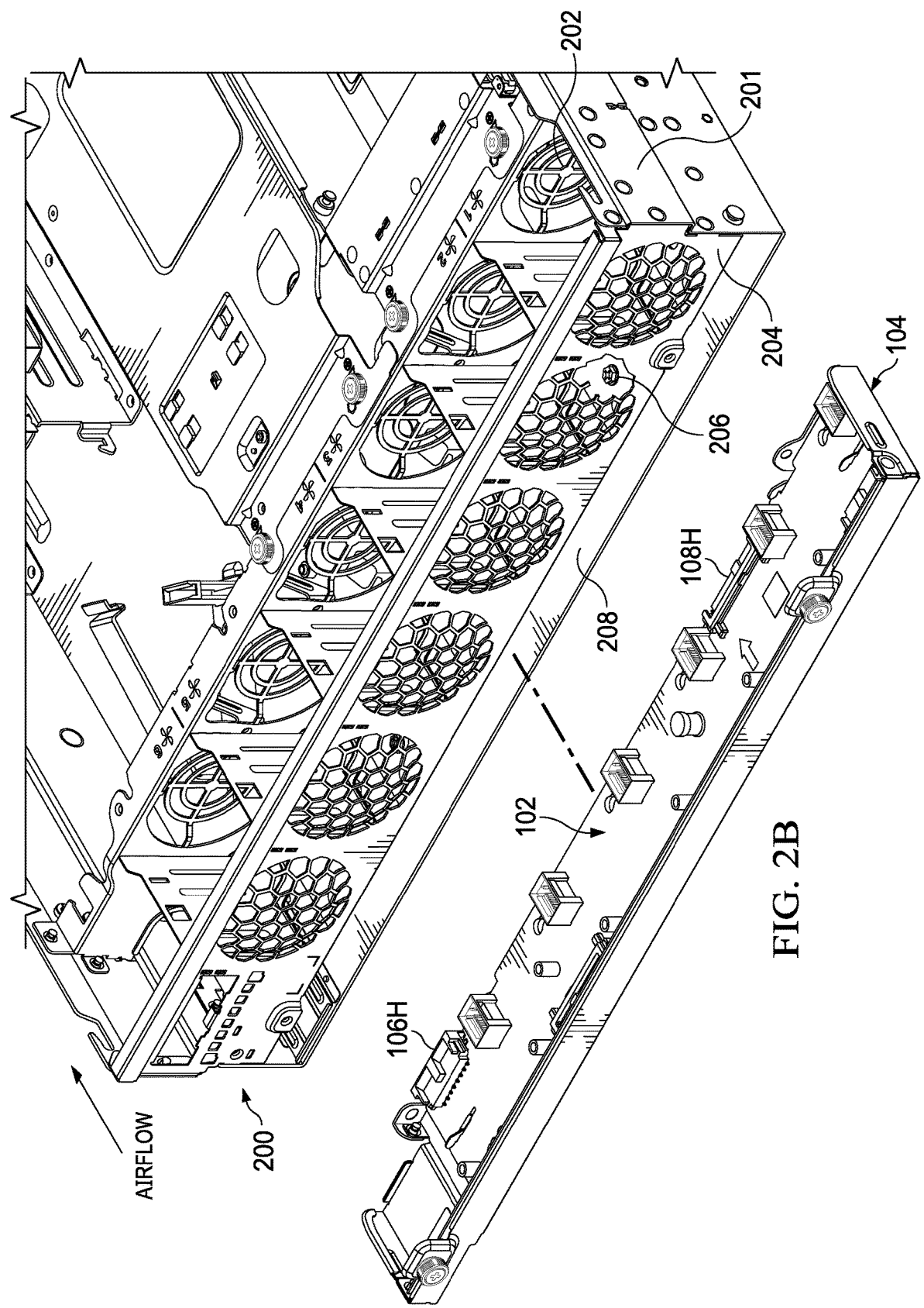
FIG. 2B illustrates an example information handling system configured in a hot-aisle configuration, in accordance with embodiments of the present disclosure.

FIG. 2A illustrates an example information handling system 200 configured in a cold-aisle configuration, in accordance with embodiments of the present disclosure. FIG. 2B illustrates example information handling system 200 configured in a hot-aisle configuration, in accordance with embodiments of the present disclosure. In some embodiments, an information handling system 200 may comprise a server chassis configured to house a plurality of servers or "blades."

As depicted in FIGS. 2A and 2B, information handling system 200 may include a chassis 201 having an air mover cage 202 for receiving and housing air movers. Chassis 201 may be an enclosure that serves as a container for various information handling resources of information handling system 200, and may be constructed from steel, aluminum, plastic, and/or any other suitable material. Although the term "chassis" is used, chassis 201 may also be referred to as a case, cabinet, tower, box, enclosure, and/or housing.

Air mover cage 202 may comprise any suitable substructure within chassis 201 configured with a plurality of slots or bays, each slot or bay configured to house a corresponding air mover. As shown in FIGS. 2A and 2B, air mover cage 202 may include a floor 204. In the cold-aisle configuration of information handling system 200, a screw 206 may be inserted at a cold-aisle screw location as shown in FIG. 2A, while in the hot-aisle configuration of information handling system 200, screw 206 may be inserted at a hot-aisle screw location as shown in FIG. 2B. As described in greater detail below, when screw 206 is inserted at the cold-aisle screw location, screw 206 may prevent insertion of the assembly of air mover board 102 and air mover tray 104 in the hot-aisle configuration of air mover board 102. Similarly, when screw 206 is inserted at the hot-aisle screw location, screw 206 may prevent insertion of the assembly of air mover board 102 and air mover tray 104 in the cold-aisle configuration of air mover board 102.

Further, when information handling system 200 is in the cold-aisle configuration, the assembly of air mover board 102 and air mover tray 104 in the cold-aisle configuration of air mover board 102 may be inserted into a corresponding slot 208 of chassis 201 under floor 206, in order to blind-mate cold-aisle configuration power connector 106C and cold-aisle configuration signal connector 108C to their respective corresponding connectors on a motherboard or other backplane of information handling system 200, as described in greater detail elsewhere in this disclosure.

Also, when information handling system 200 is in the hot-aisle configuration, the assembly of air mover board 102 and air mover tray 104 in the hot-aisle configuration of air mover board 102 may be inserted into corresponding slot 208 of chassis 201 under floor 206, in order to blind-mate hot-aisle configuration power connector 106H and hot-aisle configuration signal connector 108H to their respective corresponding connectors on a motherboard or other backplane of information handling system 200, as described in greater detail elsewhere in this disclosure.

Figure 3:
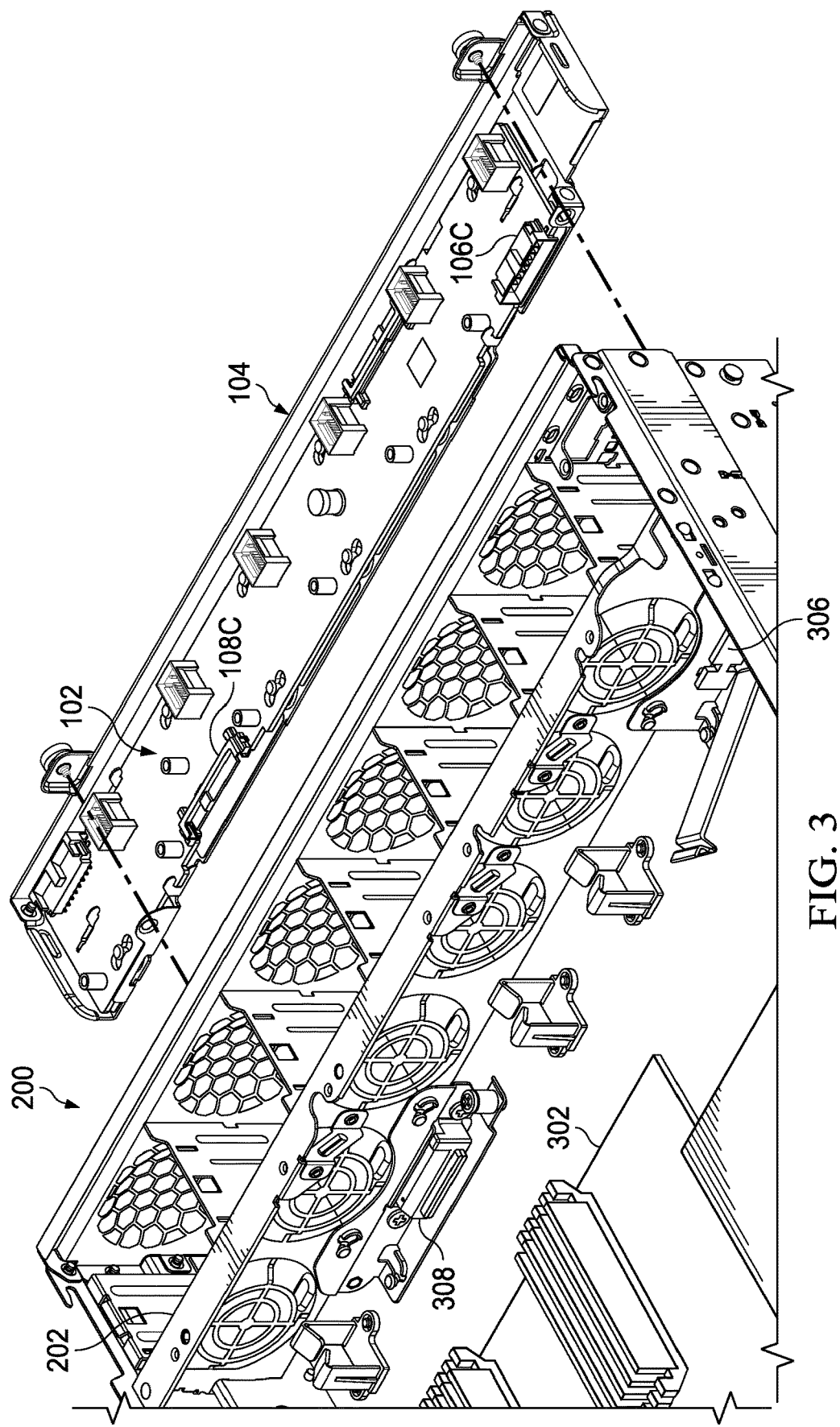
FIG. 3 illustrates an alternative view, to that shown in FIG. 2A, of an example information handling system configured in a cold-aisle configuration, in accordance with embodiments of the present disclosure.

FIG. 3 illustrates, in an alternative view to that shown in FIG. 2A, selected components of example information handling system 200 configured in the cold-aisle configuration, in accordance with embodiments of the present disclosure. As shown in FIG. 3, information handling system 102 may comprise a motherboard 302 or other backplane. As also depicted in FIG. 3, motherboard 302 may include a power connector 306 and a signal connector 308 mounted thereto.

Power connector 306 may be configured to, when coupled to a corresponding connector 106C or 106H of air mover board 102, transmit electrical energy to air mover board 102 for powering components of air mover board 102, including any air movers coupled to air mover connectors 110. Signal connector 308 may be configured to, when coupled to a corresponding connector 108C or 108H of air mover board 102, receive from or transmit to air mover board signals relating to operation of components of air mover board 102, including any air movers coupled to air mover connectors 110. Such signals may include, without limitation, driving signals for controlling air mover speeds, tachometer signals indicative of measured air mover speeds, and/or any other appropriate signals.

As further demonstrated by FIG. 3 and described elsewhere, in the cold-aisle configuration of information handling system 200 and air mover board 102, the assembly of air mover board 102 and air mover tray 104 may be inserted into slot 206 of information handling system 200 in order to blind-mate cold-aisle configuration power connector 106C to power connector 306 and blind-mate cold-aisle configuration signal connector 108C to signal connector 308. Similarly, in the hot-aisle configuration of information handling system 200 and air mover board 102, the assembly of air mover board 102 and air mover tray 104 may be inserted into slot 206 of information handling system 200 in order to blind-mate hot-aisle configuration power connector 106H to power connector 306 and blind-mate hot-aisle configuration signal connector 108H to signal connector 308.

Figure 4:
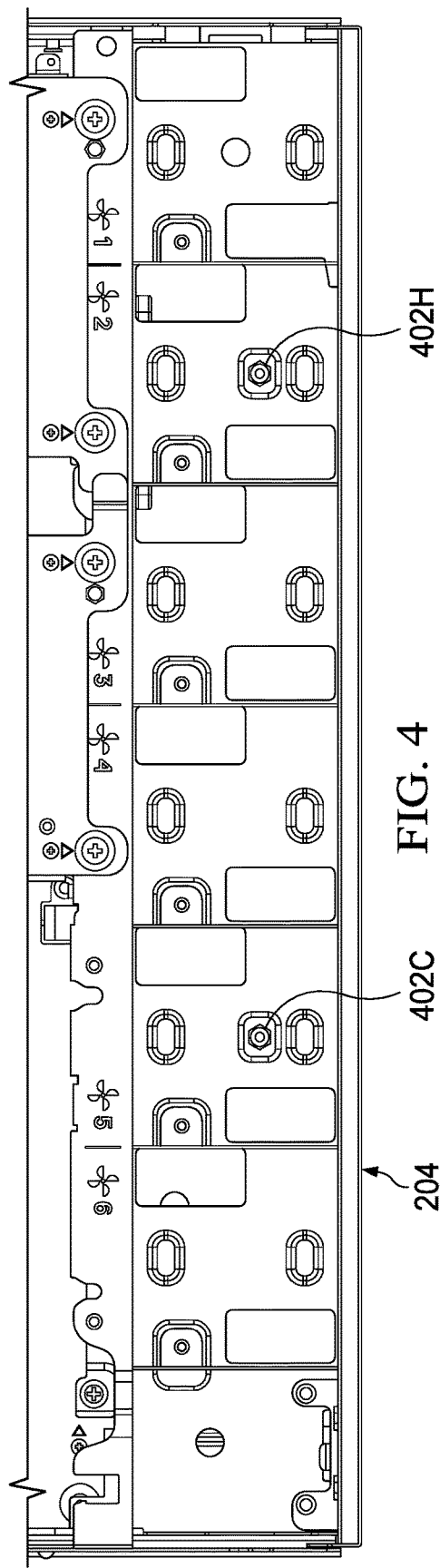
FIG. 4 illustrates an example air mover cage floor, in accordance with embodiments of the present disclosure.

FIG. 4 illustrates an example air mover cage floor 204, in accordance with embodiments of the present disclosure. As shown in FIG. 4, floor 204 may have a cold-aisle screw location 402C and a hot-aisle screw location 402H formed therein, each configured to receive screw 206. Functionality of screw 206 may be further illustrated with reference to FIGS. 5A and 5B.

Figure 5B:
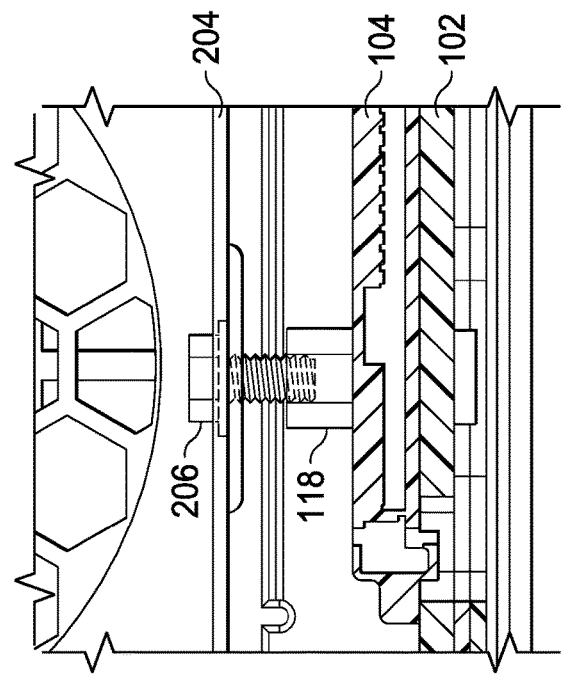
FIG. 5B depicts selected features of an information handling system when an air mover board and air mover tray are incorrectly inserted into the information handling system, in accordance with embodiments of the present disclosure.
Figure 5A:
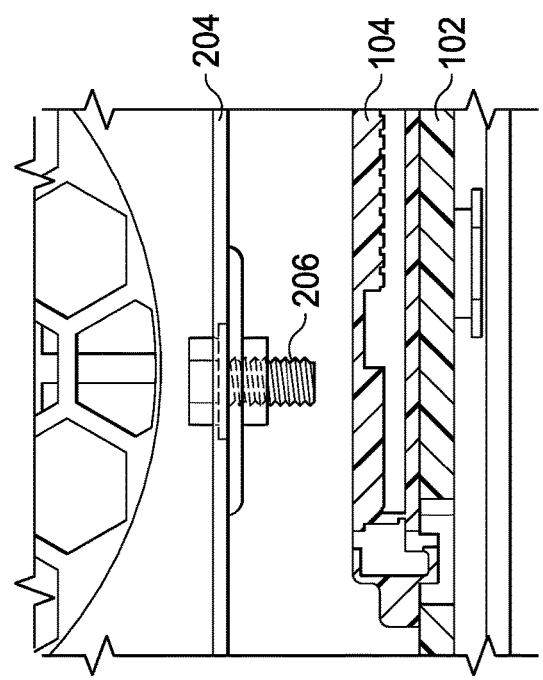
FIG. 5A depicts selected features of an information handling system when an air mover board and air mover tray are correctly inserted into the information handling system, in accordance with embodiments of the present disclosure.

FIG. 5A depicts selected features of information handling system 200 when air mover board 102 and air mover tray 104 are correctly inserted into information handling system 200, in accordance with embodiments of the present disclosure. FIG. 5B depicts selected features of information handling system 200 when air mover board 102 and air mover tray 104 are incorrectly inserted into information handling system 200, in accordance with embodiments of the present disclosure.

As shown in FIG. 5A, when air mover board 102 and air mover tray 104 are correctly inserted into information handling system 200, as might be the case when air mover board 102 and information handling system 200 are both in the cold-aisle configuration or both in the hot-aisle configuration, screw 206 may not impede insertion of air mover board 102 and air mover tray 104 into information handling system 200.

However, when an attempt is made to incorrectly insert air mover board 102 and air mover tray 104 into information handling system 200, as might be the case when air mover board 102 is in the cold-aisle configuration while information handling system 102 is in the hot-aisle configuration or when air mover board 102 is in the hot-aisle configuration while information handling system 102 is in the cold-aisle configuration, screw 206 may interact with a standoff 118 of air mover board 102 to impede insertion of air mover board 102 and air mover tray 104 into information handling system 200.

Furthermore, other standoffs 118 of air mover board 102 may interact with features of an air mover to impede insertion of an air mover with incorrect orientation relative to air mover board 102.

Figure 6A:
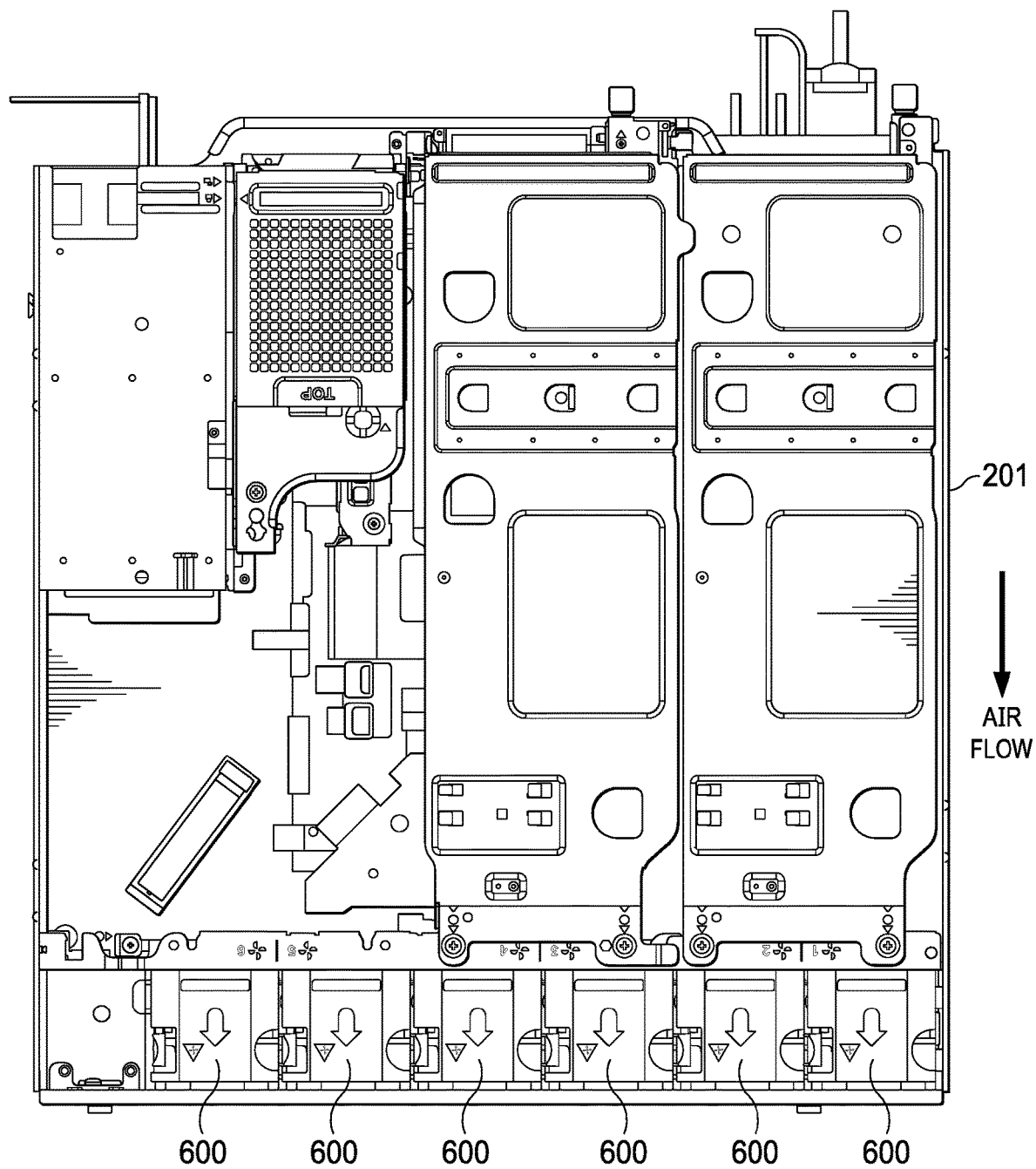
FIG. 6A illustrates a chassis and air movers in a cold-aisle configuration, in accordance with embodiments of the present disclosure.
Figure 6B:
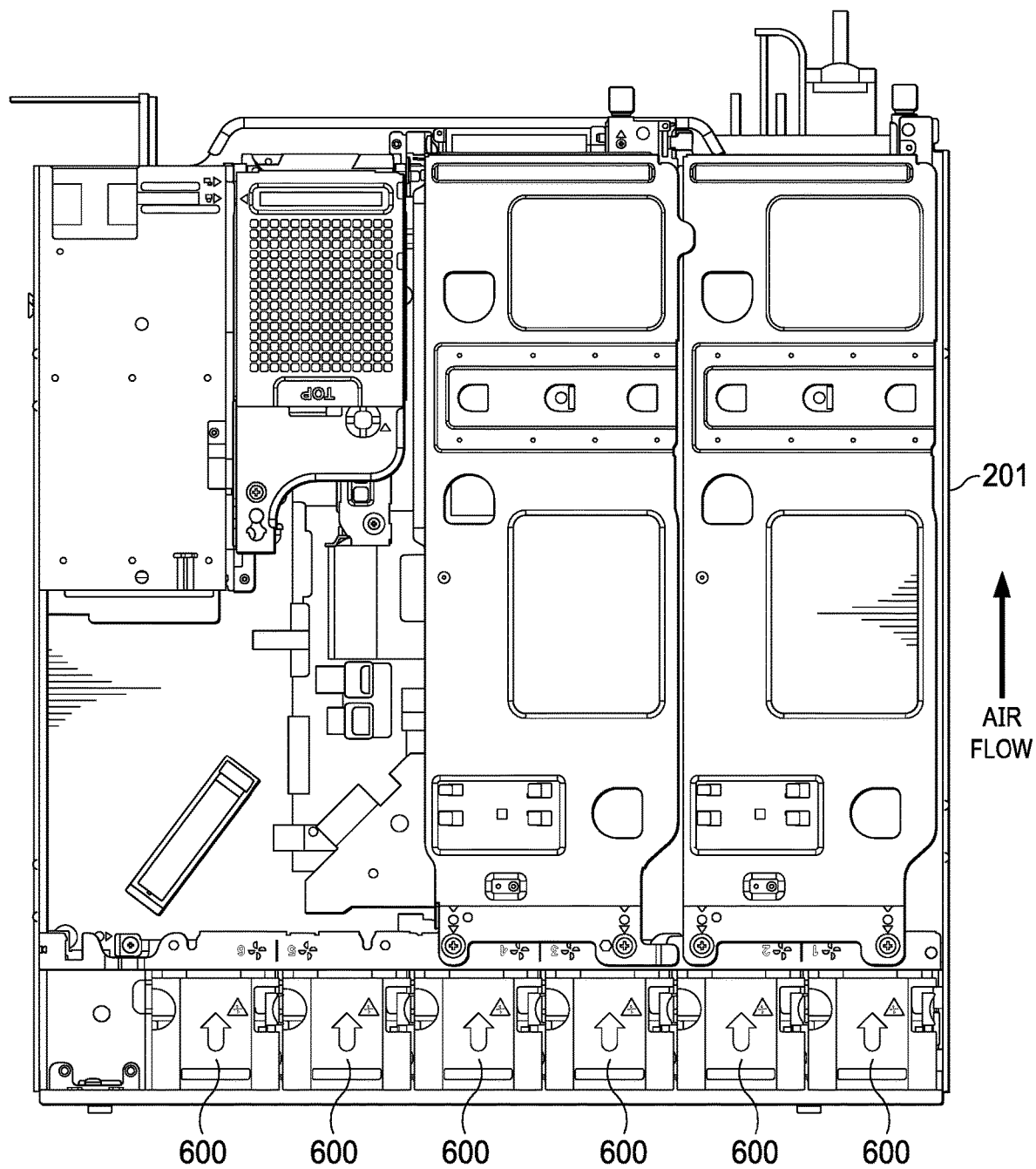
FIG. 6B illustrates a chassis and air movers in a hot-aisle configuration, in accordance with embodiments of the present disclosure.

FIG. 6A illustrates chassis 201 and air movers 600 in a cold-aisle configuration, in accordance with embodiments of the present disclosure. FIG. 6B illustrates chassis 201 an air movers 600 in a hot-aisle configuration, in accordance with embodiments of the present disclosure.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. An air mover board comprising:
   a cold-aisle power connector located on a first edge of the air mover board and configured to couple to a corresponding power connector of an information handling system when the air mover board is in a cold-aisle configuration;
   a cold-aisle signal connector located on the first edge of the air mover board and configured to couple to a corresponding signal connector of the information handling system when the air mover board is in the cold-aisle configuration;
   a hot-aisle power connector located on a second edge of the air mover board opposite that of the first edge and configured to couple to the corresponding power connector of an information handling system when the air mover board is in a hot-aisle configuration; and
   a hot-aisle signal connector located on the second edge of the air mover board and configured to couple to the corresponding signal connector of the information handling system when the air mover board is in the hot-aisle configuration;
   a plurality of mechanical features configured to align the air mover board relative to an air mover tray and maintain the air mover board in a fixed position relative to the air mover tray, wherein the plurality of mechanical features includes a feature configured to:
  mechanically couple to a first feature of the air mover tray in the cold-aisle configuration in order to maintain the air mover board in the fixed position relative to the air mover tray;
  mechanically couple to a second feature of the air mover tray in the hot-aisle configuration in order to maintain the air mover board in the fixed position relative to the air mover tray; and
  wherein the feature is permanently coupled to the air mover board.

2. The air mover board of claim 1, wherein the feature comprises a plunger and each of the first feature and the second feature comprise a hole formed in the air mover tray.

3. The air mover board of claim 1, further comprising a mechanical feature preventing:
  insertion of the air mover board when in the cold-aisle configuration into the information handling system when in a hot-aisle configuration of the information handling system; and
  insertion of the air mover board when in the hot-aisle configuration into the information handling system when in a cold-aisle configuration of the information handling system.

4. The air mover board of claim 3, wherein the mechanical feature comprises a standoff configured to interact with a counterpart mechanical feature of the information handling system, wherein the counterpart mechanical feature is positioned in the information handling system based on whether the information handling system is in the hot-aisle configuration of the information handling system or in the cold-aisle configuration of the information handling system.

5. An air mover tray comprising:
  a plurality of mechanical features configured to align an air mover board relative to the air mover tray and maintain the air mover board in a fixed position relative to the air mover tray, wherein the plurality of mechanical features includes:
    a first feature configured to mechanically couple to a feature of the air mover board in a cold-aisle configuration of the air mover board in order to maintain the air mover board in the fixed position relative to the air mover tray;
    a second feature configured to mechanically couple to the feature of the air mover board in a hot-aisle configuration of the air mover board in order to maintain the air mover board in the fixed position relative to the air mover tray; and
    wherein the feature is permanently coupled to the air mover board.

6. The air mover tray of claim 5, wherein the feature comprises a plunger and each of the first feature and the second feature comprise a hole formed in the air mover tray.

7. An information handling system comprising:
  a chassis;
  a backplane housed within the chassis, the backplane comprising a power connector and a signal connector;
  an air mover cage formed in the chassis for housing a plurality of air movers;
  a bay formed in the chassis adjacent to the air mover cage and configured to receive an assembly of an air mover board and an air mover tray; and
  the air mover board, wherein the air mover board includes:
    a plurality of air mover connectors, each air mover connector configured to electrically couple an air mover housed in the air mover cage to the air mover board;
    a cold-aisle power connector located on a first edge of the air mover board and configured to couple to the power connector when the air mover board is in a cold-aisle configuration;
    a cold-aisle signal connector located on the first edge of the air mover board and configured to couple to a corresponding signal connector of the information handling system when the air mover board is in the cold-aisle configuration;
    a hot-aisle power connector located on a second edge of the air mover board opposite that of the first edge and configured to couple to the corresponding power connector of an information handling system when the air mover board is in a hot-aisle configuration; and
    a hot-aisle signal connector located on the second edge of the air mover board and configured to couple to the corresponding signal connector of the information handling system when the air mover board is in the hot-aisle configuration.

8. The information handling system of claim 7, wherein the air mover board further comprises a plurality of mechanical features configured to align the air mover board relative to the air mover tray and maintain the air mover board in a fixed position relative to the air mover tray.

9. The information handling system of claim 8, wherein the plurality of mechanical features includes a feature configured to:
  mechanically couple to a first feature of the air mover tray in the cold-aisle configuration in order to maintain the air mover board in the fixed position relative to the air mover tray; and
  mechanically couple to a second feature of the air mover tray in the cold-aisle configuration in order to maintain the air mover board in the fixed position relative to the air mover tray.

10. The information handling system of claim 9, wherein the feature comprises a plunger and each of the first feature and the second feature comprise a hole formed in the air mover tray.

11. The information handling system of claim 9, wherein the feature is permanently coupled to the air mover board.

12. The information handling system of claim 7, further comprising a mechanical feature located within the chassis preventing:
  insertion of the air mover board when in the cold-aisle configuration into the information handling system when in a hot-aisle configuration of the information handling system; and
  insertion of the air mover board when in the hot-aisle configuration into the information handling system when in a cold-aisle configuration of the information handling system.

13. The information handling system of claim 12, wherein the mechanical feature is configured to interact with a counterpart mechanical feature of the air mover board, wherein the mechanical feature is positioned in the information handling system based on whether the information handling system is in the hot-aisle configuration of the information handling system or in the cold-aisle configuration of the information handling system.

* * * * *